US010243078B2

(12) United States Patent
Dewey et al.

(10) Patent No.: US 10,243,078 B2
(45) Date of Patent: Mar. 26, 2019

(54) CARRIER CONFINEMENT FOR HIGH MOBILITY CHANNEL DEVICES

(71) Applicant: Intel Corporation, Santa Clara, CA (US)

(72) Inventors: Gilbert Dewey, Hillsboro, OR (US); Matthew V. Metz, Portland, OR (US); Jack T. Kavalieros, Portland, OR (US); Willy Rachmady, Beaverton, OR (US); Tahir Ghani, Portland, OR (US); Anand S. Murthy, Portland, OR (US); Chandra S. Mohapatra, Hillsboro, OR (US); Harold W. Kennel, Portland, OR (US); Glenn A. Glass, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/525,164

(22) PCT Filed: Dec. 17, 2014

(86) PCT No.: PCT/US2014/070792
§ 371 (c)(1),
(2) Date: May 8, 2017

(87) PCT Pub. No.: WO2016/099475
PCT Pub. Date: Jun. 23, 2016

(65) Prior Publication Data
US 2017/0323962 A1 Nov. 9, 2017

(51) Int. Cl.
*H01L 29/78* (2006.01)
*H01L 29/26* (2006.01)
(Continued)

(52) U.S. Cl.
CPC .......... *H01L 29/785* (2013.01); *H01L 29/267* (2013.01); *H01L 29/66795* (2013.01); *H01L 29/7781* (2013.01)

(58) Field of Classification Search
CPC  H01L 29/785; H01L 29/267; H01L 29/66795
(Continued)

(56) References Cited

U.S. PATENT DOCUMENTS 7,122,871 B2 * 10/2006 Lee ................. H01L 21/823412
257/412
7,662,679 B2 * 2/2010 Izumida ............ H01L 29/66818
257/E21.394

(Continued)

FOREIGN PATENT DOCUMENTS

JP       2009147194       7/2009

OTHER PUBLICATIONS

U.S. Appl. No. 14/572,060, filed Dec. 16, 2014, entitled "Using Trusted Execution Environments for Security of Code and Data" by Nadav Nesher, et al.

(Continued)

*Primary Examiner* — Didarul Mazumder
(74) *Attorney, Agent, or Firm* — Trop, Pruner & Hu, P.C.

(57) ABSTRACT

An embodiment includes a device comprising: a trench that includes a doped trench material having: (a)(i) a first bulk lattice constant and (a)(ii) at least one of a group III-V material and a group IV material; a fin structure, directly over the trench, including fin material having: (b) (ii) a second bulk lattice constant and (b)(ii) at least one of a group III-V material and a group IV material; a barrier layer, within the trench and directly contacting a bottom surface of the fin, including a barrier layer material having a third bulk lattice constant; wherein (a) the trench has an aspect ratio (depth to width) of at least 1.5:1, and (b) the barrier layer has a height (Continued)

not greater than a critical thickness for the barrier layer material. Other embodiments are described herein.

25 Claims, 2 Drawing Sheets

(51) Int. Cl.
*H01L 29/66* (2006.01)
*H01L 29/778* (2006.01)
*H01L 29/267* (2006.01)

(58) Field of Classification Search
USPC .................................. 257/190; 438/48, 936
See application file for complete search history.

(56) References Cited

U.S. PATENT DOCUMENTS

| | | | |
|---|---|---|---|
| 2005/0074943 A1* | 4/2005 | Lai ..................... | H01L 27/10861 438/386 |
| 2006/0292889 A1 | 12/2006 | Blanchard et al. | |
| 2009/0152623 A1 | 6/2009 | Goto et al. | |
| 2012/0074386 A1 | 3/2012 | Rachmady et al. | |
| 2012/0309139 A1 | 12/2012 | Liang et al. | |
| 2013/0001591 A1* | 1/2013 | Wu .................. | H01L 21/823821 257/77 |
| 2013/0020612 A1 | 1/2013 | Wann et al. | |
| 2013/0062699 A1 | 3/2013 | Zhu et al. | |
| 2013/0234147 A1* | 9/2013 | Wu .................... | H01L 29/66795 257/76 |
| 2014/0011341 A1* | 1/2014 | Maszara ........... | H01L 29/66795 438/478 |
| 2014/0175509 A1* | 6/2014 | Chu-Kung ........ | H01L 29/66393 257/183 |
| 2014/0175512 A1* | 6/2014 | Chu-Kung ...... | H01L 21/823821 257/190 |
| 2014/0225065 A1 | 8/2014 | Rachmady et al. | |
| 2014/0264438 A1 | 9/2014 | Holland et al. | |
| 2014/0329376 A1* | 11/2014 | Sanchez ............ | H01L 21/02381 438/492 |
| 2015/0255545 A1* | 9/2015 | Holland ............ | H01L 29/66795 257/288 |
| 2015/0263159 A1* | 9/2015 | Ching ................... | H01L 29/785 257/77 |

OTHER PUBLICATIONS

International Searching Authority, "Notification of Transmittal of the International Search Report and the Written Opinion of the International Searching Authority," dated Sep. 14, 2015, in International application No. PCT/US2014/070792.

European Patent Office, Extended European Search Report dated Nov. 26, 2018 for European Patant Application No. 14908566.4, 10 pages.

Taiwan Intellectual Property Office, First Office Action dated Dec. 25, 2018 for Taiwan Application Patant No. 104137344, four pages.

* cited by examiner

US 10,243,078 B2

CARRIER CONFINEMENT FOR HIGH MOBILITY CHANNEL DEVICES

TECHNICAL FIELD

Embodiments of the invention are in the field of semiconductor devices and, in particular, non-planar transistors.

BACKGROUND

A FinFET is a transistor built around a thin strip of semiconductor material (referred to as the "fin"). The transistor includes the standard field effect transistor (FET) nodes/components: a gate, a gate dielectric, a source region, and a drain region. The conductive channel of the device resides on the outer sides of the fin beneath the gate dielectric. Specifically, current runs along both "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1:
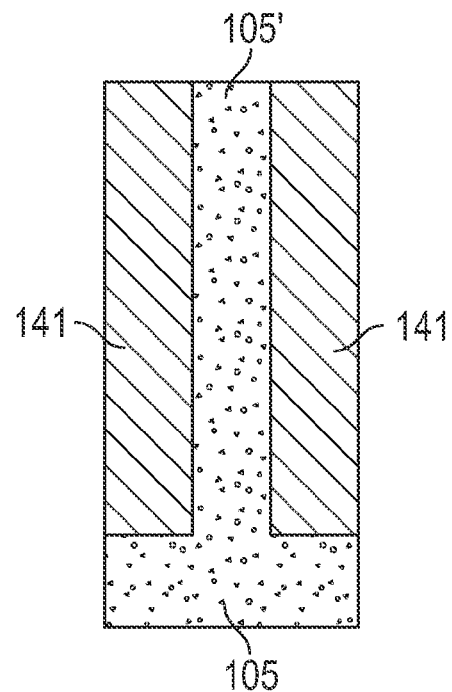
FIG. 1 depicts a processing step regarding silicon fin formation in an embodiment of the invention.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Carriers (e.g., electrons and holes) may need to be confined in high mobility channels, such as channels that include group III-V materials (e.g., GaAs) or group IV materials (e.g., Ge or SiGe). Carrier confinement can lead to desirable device properties, such as good electrostatics. Carrier confinement can be obtained using several methods. One such method includes using heterojunction energy band offsets between the channel and the subfin (the area directly below the fin such as in a trench). Another such method obtains carrier confinement using doping of the subfin materials. However, both of these methods have drawbacks. Wide band-gap materials that can confine the carriers in the channel and are lattice matched to the channel may not grow well in a trench having a high aspect ratio (e.g., greater than or equal to 2:1 height:width) due to a propensity for such materials to have growth interactions with the trench sidewall resulting in defect formation along the trench sidewall (i.e., stacking faults in the crystal). Further, there is a propensity for such materials to grow from sidewalls of the trench thereby forming a seam where materials growing from opposing trench sidewalls meet one another. Further, regardless of the ability to grow the materials within the trench, choosing trench fill materials that are lattice matched to the channel materials (to avoid undesirable defects at the channel/trench or channel/sub-fin material interface) limits the choices of wide band gap materials, which can limit the ability to truly confine the carriers. Also, high doping can lead to dopants diffusing or migrating into the channel and degrading carrier mobility.

However, an embodiment avoids or limits these shortcomings (e.g., poor growth of materials within trench, limited choice of material to grow within trench, undesirable dopant migration into channel) by locating a thin and, in some embodiments, wide band gap material directly below the channel. The thin layer of material may be below the channel and above other material in the trench. This thin "barrier" layer confines carriers in the channel due to its bandgap differential with the channel material. The embodiment addresses the shortcomings because, for example, the thinness of the barrier layer reduces the need for lattice matching between the channel and the barrier layer (e.g., if the thin layer is thinner than the critical thickness of the thin layer material and the thin layer does not fill the whole trench), thereby increasing the different types of materials that may be used in the barrier layer as well as the materials that fill the trench below the barrier layer. The embodiment also addresses the shortcomings because, for example, the thinness of the barrier layer removes/lessens concerns regarding seam formation because barrier layer is not used to fill a deep trench. The embodiment also addresses the shortcomings because, for example, some wide band gap materials act as dopant diffusion barriers that prevent dopant movement into the channel. Thus, an embodiment includes a thin layer of wide band gap material below a high mobility channel to confine carriers in the channel and prevent dopant diffusion into the channel. This improves transistor electrostatics and preserves the high mobility channel properties.

As a side note, a band gap (also called an energy gap or bandgap) is an energy range in a solid where no electron states can exist. In graphs of the electronic band structure of solids, the band gap generally refers to the energy difference (in electron volts, or eV) between the top of the valence band and the bottom of the conduction band of the material. The band gap energy is equivalent to the energy required to free an outer shell electron from its orbit about the nucleus to become a mobile charge carrier that is able to move freely within the solid material.

As another side note, the growth of certain materials upon one another presents many challenges. Crystal defects are generated by lattice mismatch, polar-on-nonpolar mismatch, and thermal mismatch between layers. When the lattice mismatch between, for example, a layer and a substrate exceeds a few percent, the strain induced by the mismatch becomes too large and defects are generated in the above layer by relaxing the upper layer/film. Once the film thickness is greater than the critical thickness (i.e., film is fully strained below this thickness and partially relaxed above this thickness), the strain is relaxed by creating misfit dislocations at the film and substrate interface as well as in the upper film. Regarding critical layer thickness, if the thickness of a layer is kept small enough to maintain elastic strain energy below energy of dislocation formation, the strained-layer structure will be thermodynamically stable against dislocation formation and is said to be below its critical layer thickness. Exceeding the critical layer thickness results in relaxation brought on by defects. The crystal defects may be in the form of threading dislocations, stacking faults and twins. Many defects, particularly threading dislocations and twins, tend to propagate into the "device layer" where the semiconductor device is fabricated. Generally, the severity of defect generation correlates to the amount of lattice mismatch between the layers.

As yet another side note, embodiments may use a trench that provides for aspect ratio trapping (ART). ART is based on threading dislocations that propagate upwards at a specific angle. ART trenches limit induced material defects (e.g., dislocations) to layers below the channel region and within the trench, thereby producing relatively defect free channels that operate more efficiently than would be the case if the channels included defects.

Figure 2:
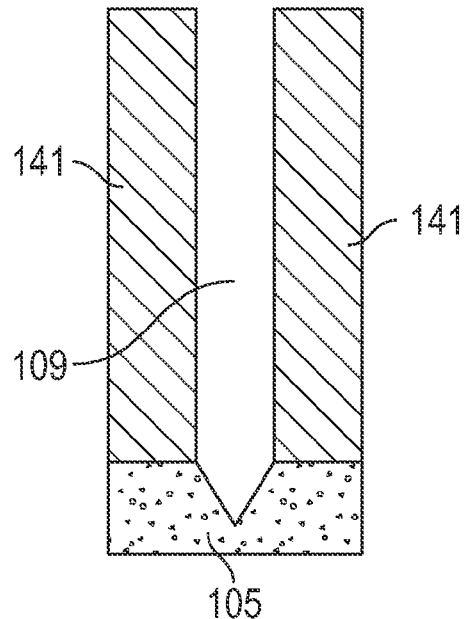
FIG. 2 depicts a processing step regarding trench formation in an embodiment of the invention.
Figure 3:
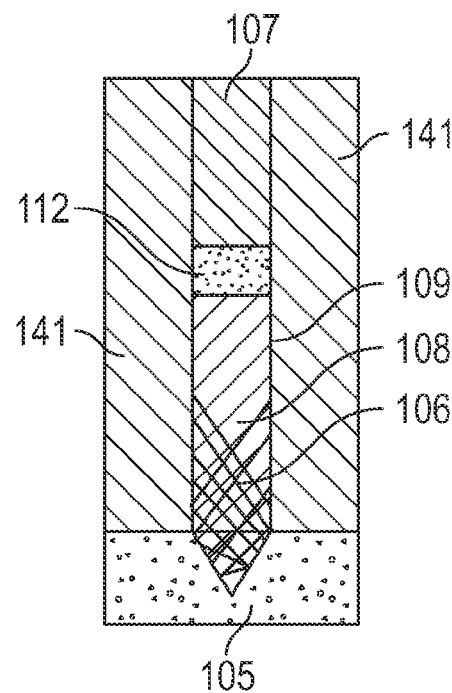
FIG. 3 depicts a processing step regarding trench fill, barrier layer formation, and channel formation in an embodiment of the invention.
Figure 4:
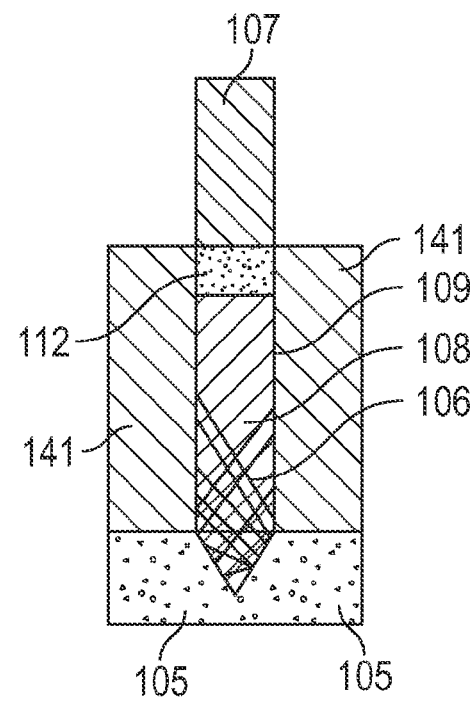
FIG. 4 depicts a processing step regarding oxide removal and fin exposure in an embodiment of the invention.

FIG. 1 includes a silicon substrate 105 and silicon fin 105' within insulation material (e.g., interlayer dielectric (ILD)) 141, also referred to as shallow trench isolation (STI). FIG. 2 depicts a processing step regarding trench 109 formation within ILD 141 and substrate 105. FIG. 3 depicts a processing step regarding trench fill whereby trench fill material 108 is formed within trench 109 to trap dislocations/defects 106 against sidewalls of trench 109. The defects occur due to lattice mismatch between substrate 105 (e.g., Si) and the fill material 108 (e.g., III-V material). Atop fill material 108 is barrier layer 112 and channel 107. Much of the detail regarding FIG. 3 is covered more fully below in regards to FIG. 5. FIG. 4 depicts a processing step regarding oxide removal 141 and fin exposure (to exposed channel 107).

Figure 5:
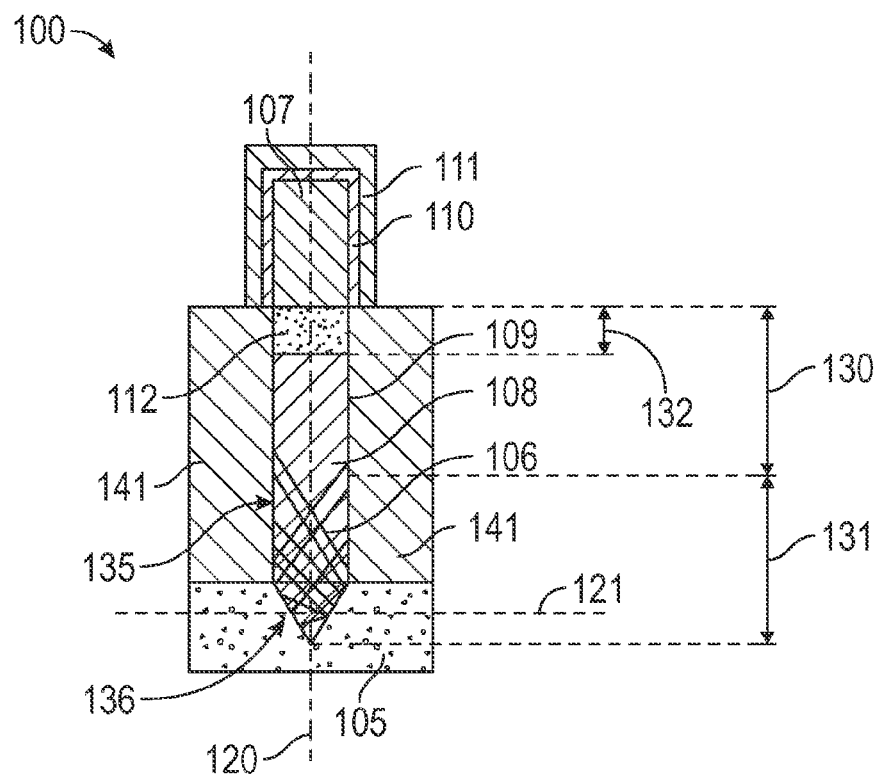
FIG. 5 includes a cross-sectional view of an embodiment of the invention.

FIG. 5 includes a device 100 with an ART trench 109 formed within ILD 141 and atop substrate 105. Substrate 105 may include, for example, Si. In ART a trench is made in a first semiconductor (105) with a high enough aspect ratio such that the defects 106 in a second semiconductor (108) located in the trench terminate on the sidewall of the trench and any layer above the terminations (e.g., layer 107) is relatively defect free.

A person of ordinary skill in the art will understand "substantially no defects" or "relatively defect free" to not be an absolute term but rather to be a relative term dictated by, for example, resolution of the imaging source (e.g., transmission electron microscope (TEM)) used to image the layer. For example, "substantially no defects" may be interpreted as less than 1 part per million (ppm).

Wide band gap materials (e.g., AlAs) slow the diffusion of dopants. Including such materials in the thin barrier layer 112 allow a wide selection of III-V material systems 108 (and IV materials systems in some embodiments) to be chosen to fill the majority of the trench 109 below the channel 107. The trench fill materials 108 may be highly doped to eliminate parasitic sub-fin leakage. Further, the wide band-gap material 112, directly below the channel 107, confines the carriers in the channel and serves as a dopant diffusion barrier to doped materials 108 without having to fill the whole trench 109 with dopant diffusion barrier 112 or having barrier layer 112 be exactly lattice matched to channel 107.

The embodiment of FIG. 5 has many benefits. For example, the sub-fin fill material 108 can be chosen for best fill or doping properties, without regard to lattice match with channel 107. Embodiments including Al within wide band gap material 112 are effective dopant diffusion barriers (e.g., AlAs, InAlAs). Also, in an embodiment diffusion barrier 112 is thin and enables non-lattice matched materials (i.e., materials 112 are not lattice matched with channel materials 107) if such materials do not exceed their critical layer thickness. In an embodiment, oxide removal recess does not have to be exact to control sub-fin leakage like it would have to be using doping alone for carrier confinement. Consequently, this enables fin processing repeatability which provides better product yields. Also, the embodiment of FIG. 1 includes wide band gap materials 112 that are undoped (or at least not as heavily doped as materials 108), junction capacitance will decrease leading to better electrostatics for device 100. Further, not only do wide band gap materials 112 confine carriers in a channel, such materials also slow dopant diffusion from materials 108 upwards towards channel 107.

Thus, embodiments provide good electrostatics which lead to better transistor control (e.g., on/off states) all while retaining high mobility properties of the channel and further while allowing for a large scope of possible III-V and/or IV materials for trench materials 108 (which help confine carriers in channel 107).

While FIG. 5 discloses a trigate, other embodiments may include a bigate (dual gate) transistor structure. For example, the bigate may be formed along the sidewalls of channel layer 107 but not along the top of channel layer 107.

In embodiments, gate dielectric 110 materials include, for example, insulating materials, such as, silicon dioxide ($SiO_2$), silicon oxynitride, silicon nitride, and/or high-k dielectric materials. In general, a high-k dielectric is a dielectric material having a dielectric constant greater than that of $SiO_2$. Exemplary high-k dielectric materials include hafnium dioxide ($HfO_2$), hafnium silicon oxide, lanthanum oxide, lanthanum aluminum oxide, zirconium dioxide ($ZrO_2$), zirconium silicon oxide, titanium dioxide ($TiO_2$), tantalum pentaoxide ($Ta_2O_5$), barium strontium titanium oxide, barium titanium oxide, strontium titanium oxide, yttrium oxide, aluminum oxide, lead scandium tantalum oxide, lead zinc niobate, and other materials known in the semiconductor art.

In an embodiment, gate electrode 111 materials include, for example, materials such as Ti, W, Ta, Al, and alloys thereof, and alloys with rare earth elements, such as Er, Dy or noble metals such as Pt, and nitrides such as TaN, and TiN.

In an embodiment, materials for sources and/or drains include, for example, Si, carbon doped Si, and phosphorus doped Si, for NMOS, and boron doped $Si_XGe_{1-X}$, boron doped Ge, boron doped $Ge_XSn_{1-X}$, and p-doped III-V compounds for PMOS applications.

Figure 6:
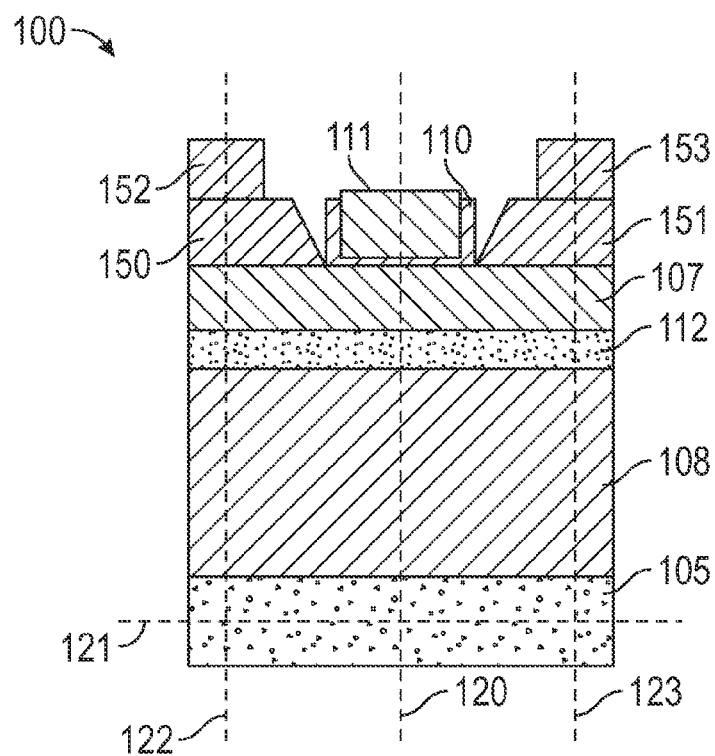
FIG. 6 includes a side view of an embodiment of the invention.

FIG. 6 includes a side view of an embodiment, including raised source 150, drain 151, and contacts 152, 153. Barrier layer 112 is below channel 107. Metal gate 111 and gate oxide 110 are on channel 107. Fill material 108 is on substrate 105.

Typical dielectric materials used for dielectric layer 141, features, and/or ILD include silicon dioxide and low-k dielectric materials. Additional dielectric materials that may be used include, carbon doped oxide (CDO), silicon nitride, silicon oxynitride, silicon carbide, organic polymers such as perfluorocyclobutane or polytetrafluoroethylene, fluorosilicate glass (FSG), and/or ganosilicates such as silsesquioxane, siloxane, or organosilicate glass. The dielectric layer may include pores to further reduce the dielectric constant.

Devices shown herein can comprise additional structures, such as insulating layers enclosing devices, additional substrate layers, metal trenches and vias connecting sources and drains to other components of an IC device, and other additional layers and/or devices. Components illustrated as one layer for simplicity, can comprise a plurality of layers of the same or a different material depending, for example, on the manufacturing processes employed in constructing the device and the desired properties of the device.

Implementations of the invention are housed on a substrate 105, such as a semiconductor wafer. Substrate surfaces on which transistor structures according to embodiments of the invention can be formed include, for example, H-terminated silicon, silicon dioxide, silicon, silicon germanium, a group III-V (or a group 13-14 in additional periodic table column numbering schemes) compound semiconductor, a main-group oxide, a metal, and/or a binary or mixed metal oxide. Layers and layers comprising devices can also be described as the substrate or part of the substrate on which embodiments of the invention are fabricated. The substrate base on which semiconductor devices are built is typically a semiconductor wafer that is diced apart to yield individual IC chips. The base substrate on which a chip is built is typically a silicon wafer, although embodiments of the invention are not dependent on the type of substrate used. The substrate could also be comprised of germanium, indium antimonide, lead telluride, indium arsenide, indium phosphide, gallium arsenide, gallium antimonide, and/or other group III-V materials either alone or in combination with silicon or silicon dioxide or other insulating materials. A substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes a device comprising: a silicon substrate with a trench that includes a doped trench material having a first bulk lattice constant and a group III-V material; a fin structure, directly over the trench, including fin material having a second bulk lattice constant and at least one of a group III-V material and a group IV material; a barrier layer, within the trench and directly contacting a bottom surface of the fin, including a barrier layer material having a third bulk lattice constant; wherein (a) the trench has an aspect ratio (depth to width) of at least 2:1, and (b) the barrier layer has a height not greater than a critical thickness for the barrier layer material.

For example, as shown in FIG. 1 trench 109 may be formed in substrate 105. Substrate 105 may itself be formed on other layers, such as an insulation layer or a substrate base. Also, regarding "bulk lattice constant", if a "lattice constant" is a distance between atoms in cubic-cell crystals then a "bulk lattice constant" relates to the material in a bulk state without influence from surrounding layers. Thus, the material for layer 112 may have a bulk lattice constant that is unequal to the lattice constant of layer 112 when layer 112 is influenced by layers 108 and/or 107.

An embodiment includes trench 109 that includes a doped trench material. The doped trench material has a first bulk lattice constant and includes a group III-V material, such as GaAs, InP, GaP, and GaN and the like. An embodiment includes a fin material having a second bulk lattice constant and at least one of a group III-V material and a group IV material. Thus, the fin material may include GaAs, InP, GaP, GaN, SiGe, Ge and the like.

In an embodiment the trench has an aspect ratio of at least 2:1 but in other embodiments the ratio is 1.3:1, 1.4:1, 1.5:1, 1.6:1, 1.7:1, 1.8:1, 1.9:1, 2.1:1, 2.2:1 and greater.

In example 2 the subject matter of the Example 1 can optionally include wherein the substrate has a substrate bulk lattice constant unequal to the first bulk lattice constant and the first bulk lattice constant is generally equal to the third bulk lattice constant.

For example, a Si substrate would have an unequal bulk lattice constant to that of GaAs in material 108. For example, by generally equal the first and third bulk lattice constants may be within 1% of each other. Thus, portions 107, 108 may include the same materials, such as GaAs, InP, GaP, GaN, SiGe, Ge and the like.

In example 3 the subject matter of the Examples 1-2 can optionally include wherein the first, second, and third bulk lattice constants are all unequal to one another.

For example, portion 107 may include SiGe or Ge, portion 108 may include GaAs, InP, GaP, and/or GaN, and portion 112 may include AlAs, InAlAs, and the like.

In example 4 the subject matter of the Examples 1-3 can optionally include wherein the second and third bulk lattice constants are unequal to each other.

For example, portion 107 may include SiGe or Ge and portion 112 may include AlAs, InAlAs and the like. This is provides an advantage because, with portion 112 having a height not greater than a critical thickness for the barrier layer material, no or few defects will be at the 112/107 interface causing problems for channel 107.

In example 5 the subject matter of the Examples 1-4 can optionally include wherein the doped trench material is doped more heavily than the barrier layer material.

For example, the barrier layer 112 may have some doping due to migration of dopants from portion 108.

In example 6 the subject matter of the Examples 1-5 can optionally include wherein the barrier layer material is undoped.

In example 7 the subject matter of the Examples 1-6 can optionally include wherein (a) the fin includes a channel, a source, and a drain, (b) the channel includes a channel material that includes the fin material, and (c) the barrier layer material has a band gap greater than a band gap of the channel material.

Thus, an embodiment uses material 112 to protect against dopant migration from portion 108 into channel 107 and also provides containment to carriers in channel 107.

In example 8 the subject matter of the Examples 1-7 can optionally include wherein the barrier layer material has a conduction band offset with respect to the channel conduction band of >0.3 eV for electrons in the channel and >0.3 eV valence band offset for holes in the channel.

In example 9 the subject matter of the Examples 1-8 can optionally include wherein the channel is directly over the trench, a vertical axis intersects the channel and the trench, and a horizontal axis coplanar with the substrate is orthogonal to the vertical axis.

For example, axis 120 intersects channel 107 and trench 109. Axis 120 is orthogonal to axis 121.

In example 10 the subject matter of the Examples 1-9 can optionally include wherein the fin is not monolithic with the substrate.

For example, material 108 is not monolithic with substrate 105 considering material 108 is trench fill material that replaced an original fin portion that was removed and that was monolithic with substrate 105.

In example 11 the subject matter of the Examples 1-10 can optionally include wherein the barrier layer material includes aluminum.

In various embodiments material 112 may include, for example, InP, GaAs, AlAs, InAlAs, GaSb, AlGaSb, GaP and the like (with varying ratios of Al to As, In to Al to As, and the like).

In example 12 the subject matter of the Examples 1-11 can optionally include wherein the fin includes a channel, a source, and a drain, and the channel is epitaxial.

In example 13 the subject matter of the Examples 1-12 can optionally include wherein barrier layer material is in an upper half of the trench but not a lower half of the trench.

For example, trench 109 has an upper half 130 and lower half 131 and layer 112 is in upper half 130.

In example 14 the subject matter of the Examples 1-13 can optionally include wherein the upper half of the trench has fewer defects than the lower half of the trench.

For example, there are fewer to no defects 106 in upper half 130 as opposed to lower half 131.

In example 15 the subject matter of the Examples 1-14 can optionally include wherein the barrier layer directly contacts a top surface of the trench material.

In example 16 the subject matter of the Examples 1-15 can optionally include wherein the channel is directly over the trench, a first vertical axis intersects the channel and the barrier layer, a second vertical axis intersects a source, corresponding to the channel, and the barrier layer, a third vertical axis intersects a drain, corresponding to the channel, and the barrier layer, and a horizontal axis coplanar with the substrate is orthogonal to the first, second, and third vertical axes.

For example, axis 120 intersects channel 107, barrier layer 112, and trench fill material 108 within trench 109 (not shown). Axis 120 is orthogonal to axis 121. Vertical axis 122 intersects source 150 and barrier layer 112. Vertical axis 123 intersects drain 151 and barrier layer 112.

In example 17 the subject matter of the Examples 1-16 can optionally include wherein the barrier layer includes a maximum depth, extending from a bottom surface of the barrier layer to a top surface of the barrier layer, of no more than 30 nm.

However, in various embodiments this layer could be as thin as 2 nm and as thick as 30 nm. For example, layer 112 may include depth 132.

In example 18 the subject matter of the Examples 1-17 can optionally include wherein a bottommost portion of the trench includes a 1:1:1 plane and a middle portion of the trench includes a 1:0:0 plane.

For example, bottom of trench 109 may include a 1:1:1 plane 136, a 1:0:0 plane 135, or a rounded bottom consisting of multiple planes.

In example 19 the subject matter of the Examples 1-18 can optionally include wherein the second and third bulk lattice constants are unequal to each other, the first bulk lattice constant is generally equal to the third bulk lattice constant, and the channel is strained.

Thus, in an embodiment material 112 may be different from materials 108, 107 and materials 107, 108 may be the same.

Example 20 includes a device comprising: a trench that includes a doped trench material having: (a)(i) a first bulk lattice constant and (a)(ii) at least one of a group III-V material and a group IV material; a fin structure, directly over the trench, including fin material having: (b)(ii) a second bulk lattice constant and (b)(ii) at least one of a group III-V material and a group IV material; a barrier layer, within the trench and directly contacting a bottom surface of the fin, including a barrier layer material having a third bulk lattice constant; wherein (a) the trench has an aspect ratio (depth to width) of at least 1.5:1, and (b) the barrier layer has a height not greater than a critical thickness for the barrier layer material.

Whether critical thickness has been surpassed may be shown by strain in imaging (e.g., TEM). For different kinds of structures and fin widths, the critical thickness can vary significantly.

Thus, not all embodiments have Si substrates and material 108 is not limited to III-V materials.

In example 21 the subject matter of the Example 20 can optionally include wherein the second and third bulk lattice constants are unequal to each other.

In example 22 the subject matter of the Examples 20-21 can optionally include wherein the doped trench material is doped more heavily than the barrier layer material.

In example 23 the subject matter of the Examples 20-22 can optionally include wherein (a) the fin includes a channel, a source, and a drain, (b) the channel includes a channel material that includes the fin material, and (c) the barrier layer material has a band gap greater than a band gap of the channel material.

In example 24 the subject matter of the Examples 20-23 can optionally include wherein the barrier layer material includes aluminum.

In example 25 the subject matter of the Examples 20-24 can optionally include wherein the barrier layer directly contacts a top surface of the trench material.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A device comprising:
    a silicon substrate with a trench that includes a doped trench material having a first bulk lattice constant and a group III-V material;
    a fin structure directly over the trench and including fin material having a second bulk lattice constant and at least one of a group III-V material or a group IV material;
    a barrier layer within the trench and directly contacting a bottom surface of the fin structure and including a barrier layer material having a third bulk lattice constant;
    wherein the trench has an aspect ratio that includes a depth to width ratio of at least 2:1, and the barrier layer has a height not greater than a critical thickness for the barrier layer material;
    wherein the barrier layer material is configured to be strained below the critical thickness and stable against dislocation formation;
    wherein the barrier layer material is configured to be at least partially relaxed above the critical thickness with defects in the barrier layer material.

2. The device of claim 1 wherein the second and third bulk lattice constants are unequal to each other.

3. The device of claim 1 wherein the first, second, and third bulk lattice constants are all unequal to one another.

4. The device of claim 1 wherein the substrate has a substrate bulk lattice constant unequal to the first bulk lattice constant and the first bulk lattice constant is substantially equal to the third bulk lattice constant.

5. The device of claim 4, wherein the doped trench material is doped more heavily than the barrier layer material.

6. The device of claim 5, wherein the barrier layer material is undoped.

7. The device of claim 4, wherein the fin structure includes a channel, a source, and a drain, the channel includes a channel material that includes the fin material, and the barrier layer material has a band gap greater than a band gap of the channel material.

8. The device of claim 7, wherein the barrier layer material has a conduction band offset with respect to a channel conduction band of more than 0.3 eV for electrons in the channel and more than 0.3 eV valence band offset for holes in the channel.

9. The device of claim 8, wherein the channel is directly over the trench, a vertical axis intersects the channel and the trench, and a horizontal axis coplanar with the substrate is orthogonal to the vertical axis.

10. The device of claim 1, wherein the fin is not monolithic with the substrate.

11. The device of claim 1, wherein the barrier layer material includes aluminum.

12. The device of claim 1, wherein the fin structure includes a channel, a source, and a drain, and the channel is epitaxial.

13. The device of claim 1, wherein the barrier layer material is in an upper half of the trench but not a lower half of the trench.

14. The device of claim 13, wherein the upper half of the trench has fewer defects than the lower half of the trench.

15. The device of claim 1, wherein the barrier layer directly contacts a top surface of the doped trench material.

16. The device of claim 1 including a channel, wherein the channel is directly over the trench, a first vertical axis intersects the channel and the barrier layer, a second vertical axis intersects a source, corresponding to the channel, and the barrier layer, a third vertical axis intersects a drain, corresponding to the channel, and the barrier layer, and a horizontal axis coplanar with the substrate is orthogonal to the first, second, and third vertical axes.

17. The device of claim 1, wherein the barrier layer includes a maximum depth, extending from a bottom surface of the barrier layer to a top surface of the barrier layer, of no more than 30 nm.

18. The device of claim 1, wherein a bottommost portion of the trench includes a 1:1:1 plane and a middle portion of the trench includes a 1:0:0 plane.

19. The device of claim 1 comprising a channel, wherein the second and third bulk lattice constants are unequal to each other, the first bulk lattice constant is substantially equal to the third bulk lattice constant, and the channel is strained.

20. A device comprising:
    a trench that includes a doped trench material having: a first bulk lattice constant and at least one of a group III-V material or a group IV material;
    a fin structure directly over the trench and including fin material having: a second bulk lattice constant and at least one of a group III-V material or a group IV material;
    a barrier layer within the trench and directly contacting a bottom surface of the fin structure and including a barrier layer material having a third bulk lattice constant;
    wherein the trench has an aspect ratio that includes a depth to width ratio of at least 1.5:1, and the barrier layer has a height not greater than a critical thickness for the barrier layer material;
    wherein the barrier layer material is configured to be strained below the critical thickness and stable against dislocation formation;
    wherein the barrier layer material is configured to be at least partially relaxed above the critical thickness with defects in the barrier layer material.

21. The device of claim 20 wherein the substrate has a substrate bulk lattice constant unequal to the first bulk lattice constant and the first bulk lattice constant is substantially equal to the third bulk lattice constant.

22. The device of claim 21, wherein the doped trench material is doped more heavily than the barrier layer material.

23. The device of claim 21, wherein the fin structure includes a channel, a source, and a drain, the channel includes a channel material that includes the fin material, and wherein the barrier layer material has a band gap greater than a band gap of the channel material.

24. The device of claim 20, wherein the barrier layer material includes aluminum.

25. The device of claim 20, wherein the barrier layer directly contacts a top surface of the doped trench material.

* * * * *